US010253139B2

(12) United States Patent
Iguchi et al.

(10) Patent No.: US 10,253,139 B2
(45) Date of Patent: Apr. 9, 2019

(54) ADDITION-CURABLE SILICONE RESIN COMPOSITION AND A SEMICONDUCTOR DEVICE

(71) Applicant: Shin-Etsu Chemical Co., Ltd., Tokyo (JP)

(72) Inventors: Hiroyuki Iguchi, Annaka (JP); Takayuki Kusunoki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 57 days.

(21) Appl. No.: 15/387,019

(22) Filed: Dec. 21, 2016

(65) Prior Publication Data

US 2017/0174841 A1 Jun. 22, 2017

(30) Foreign Application Priority Data

Dec. 22, 2015 (JP) .................................. 2015-249457
Jun. 28, 2016 (JP) .................................. 2016-128007

(51) Int. Cl.
*C08G 77/20* (2006.01)
*C08G 77/06* (2006.01)
(Continued)

(52) U.S. Cl.
CPC ............. *C08G 77/20* (2013.01); *C08G 77/06* (2013.01); *C08K 5/56* (2013.01); *C08L 83/00* (2013.01);
(Continued)

(58) Field of Classification Search
None
See application file for complete search history.

(56) References Cited

U.S. PATENT DOCUMENTS 4,609,590 A * 9/1986 Suzuki ................ C03C 25/106
   385/126
4,772,515 A * 9/1988 Hara ....................... C08J 7/047
   427/387

(Continued)

FOREIGN PATENT DOCUMENTS

EP   2 444 463 A1   4/2012
JP   59-78236 A     5/1984

(Continued)

OTHER PUBLICATIONS

European Search Report for Appl. No. 18204697.9 dated Jan. 17, 2019.

*Primary Examiner* — Robert S Loewe
(74) *Attorney, Agent, or Firm* — Birch, Stewart, Kolasch & Birch, LLP

(57) ABSTRACT

One of the purposes of the present invention is to provide an addition-curable silicone composition which provides a cured product having good performance at a low temperature and excellent resistance to a temperature change, and to provide a semiconductor device having a high reliability, whose semiconductor element is encapsulated with a product obtained by curing the addition-curable silicone composition. Thus, an addition-curable silicone resin composi- (Continued)

tion comprising (A) a branched organopolysiloxane represented by the following formula (1):

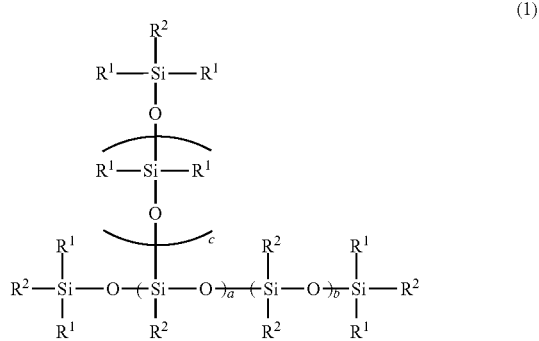

(1)

wherein a is an integer of from 2 to 100, b is an integer of from 5 to 100, c is an integer of from 5 to 100, $0.03 \leq a/(a+b) < 1.0$, and a ratio of the number of $(R^1_2R^2SiO_{1/2})$ unit to the number of $(R^2SiO_{3/2})$ unit is 2 or less; (B) an organopolysiloxane represented by the following formula (2): $(R^2_3SiO_{1/2})_r(R^2_2SiO_{2/2})_s(R^2SiO_{3/2})_t(SiO_{4/2})_u$ (2) in an amount of 5 to 900 parts by mass, relative to 100 parts by mass of component (A); (C) an organopolysiloxane having at least two hydrosilyl groups, in an amount such that a ratio of the number of the hydrosilyl groups in component (C) to the number of the alkenyl groups in components (A) and (B) is 0.4 to 4.0; and (D) a hydrosilylation catalyst in an amount sufficient to accelerate hydrosilylation.

5 Claims, 1 Drawing Sheet

(51) Int. Cl.
*H01L 33/56* (2010.01)
*C08K 5/56* (2006.01)
*C08L 83/00* (2006.01)
*C08L 83/04* (2006.01)
*C08G 77/12* (2006.01)

(52) U.S. Cl.
CPC .............. *C08L 83/04* (2013.01); *H01L 33/56* (2013.01); *C08G 77/12* (2013.01)

(56) References Cited

U.S. PATENT DOCUMENTS

| | | | | |
|---|---|---|---|---|
| 5,804,631 | A * | 9/1998 | Mine | C08K 3/08 524/440 |
| 6,417,310 | B1 | 7/2002 | Omura et al. | |
| 7,528,209 | B2 * | 5/2009 | Ito | C08L 83/04 524/861 |
| 7,943,719 | B2 * | 5/2011 | Hawker | C08G 77/06 528/14 |
| 2005/0006794 | A1 * | 1/2005 | Kashiwagi | C08L 83/04 257/788 |
| 2006/0058486 | A1 * | 3/2006 | Lautenschlager | C08G 77/20 528/31 |
| 2006/0185780 | A1 | 8/2006 | Hanada | |
| 2006/0241269 | A1 * | 10/2006 | Ochs | C08G 77/12 528/15 |
| 2006/0264567 | A1 * | 11/2006 | Shiobara | C08L 83/04 524/588 |
| 2006/0270792 | A1 * | 11/2006 | Kashiwagi | C08L 83/04 524/862 |
| 2008/0070333 | A1 | 3/2008 | Morita et al. | |
| 2011/0274935 | A1 * | 11/2011 | Yamamoto | C09D 183/04 428/447 |
| 2013/0266339 | A1 * | 10/2013 | Sugiyama | G03G 9/16 492/18 |
| 2014/0024796 | A1 * | 1/2014 | Mizunashi | G02B 1/041 528/31 |
| 2014/0367723 | A1 * | 12/2014 | Yamazaki | C08K 3/22 257/98 |
| 2015/0001569 | A1 * | 1/2015 | Yoshitake | C08L 83/14 257/98 |
| 2015/0225574 | A1 * | 8/2015 | Kanto | C08L 65/00 428/447 |

FOREIGN PATENT DOCUMENTS

| | | |
|---|---|---|
| JP | 7-224168 A | 8/1995 |
| JP | 2000-351949 A | 12/2000 |
| JP | 2001-163981 A | 6/2001 |
| JP | 2002-348377 A | 12/2002 |
| JP | 2006-93354 A | 4/2006 |
| JP | 2006-152265 A | 6/2006 |
| JP | 2006-256603 A | 9/2006 |

\* cited by examiner

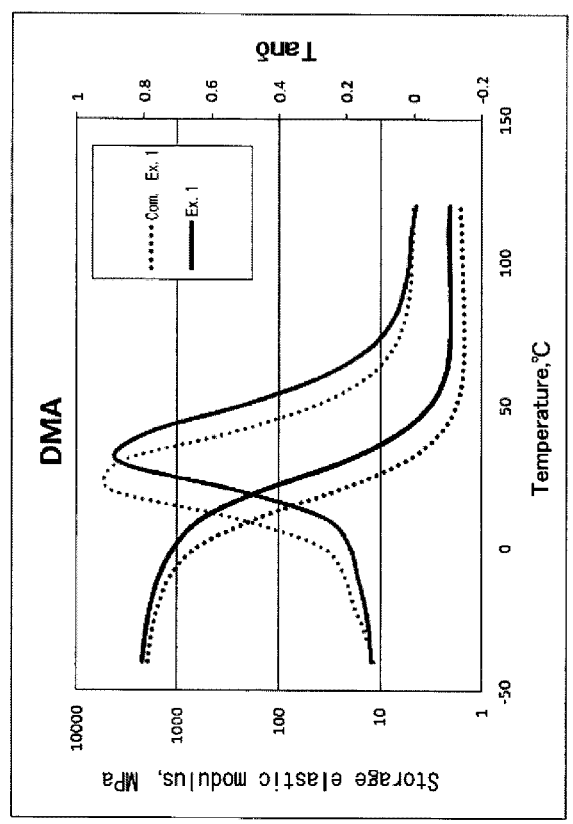

ADDITION-CURABLE SILICONE RESIN COMPOSITION AND A SEMICONDUCTOR DEVICE

CROSS REFERENCE

This application claims the benefits of Japanese Patent Application Nos. 2015-249457 filed on Dec. 22, 2015, and 2016-128007 filed on Jun. 28, 2016, the contents of which are herein incorporated by reference.

FIELD OF THE INVENTION

The present invention relates to an addition-curable silicone composition and a semiconductor device provided with a cured product thereof. Specifically, the present invention relates to an addition-curable silicone composition comprising an alkenyl group-containing branched organopolysiloxane with a long siloxane branch.

Addition-curable silicone resins have good heat resistance and light resistance and a high curing rate, so that they have been used as materials for encapsulating semiconductor elements such as LEDs. For instance, Japanese Patent Application Laid-Open No. 2006-256603 describes an addition-curable silicone resin having high adhesiveness to an LED package made of a thermoplastic resin such as PPA. Japanese Patent Application Laid-Open No. 2006-93354 describes a method for encapsulating an optical semiconductor element with an addition-curable silicone resin composition by compression molding.

As mentioned above, addition-curable silicone resins are generally used as materials for encapsulating semiconductor elements, but their performances are not sufficient. Particularly, it is important for materials encapsulating LEDs to have low-temperature resistance in addition to heat resistance and light resistance because the encapsulating materials are exposed to external stress such as changes of temperature and humidity of the atmosphere in addition to internal stress such as temperature change caused by switching an optical semiconductor device on and off. However, the conventional addition-curable silicone resins show insufficient performance at a low temperature and do not endure stress caused by temperature change, resulting in poor crack resistances.

It is known that introduction of a branch structure into a linear silicone chain is efficient as one of methods to improve a low-temperature property of a cured silicone resin. Japanese Patent Application Laid-Open Nos. 2006-256603, 2006-93354 and 2002-348377 describe methods for preparing such silicone resins. However, the method for preparing a branched organopolysiloxane by having a hydrolyzable silane having an $R^3SiO_{1/2}$ unit [M unit] and an $RSiO_{3/2}$ unit [T unit] to cause a condensation or an equilibration reaction in the presence of an acid catalyst or an alkali catalyst cannot separately control a length of the main chain and a length of the side chain. Accordingly, it was difficult to obtain a siloxane with a desired structure.

PRIOR LITERATURES

Patent Literatures

[Patent Literature 1] Japanese Patent Application Laid-Open No. 2006-256603
[Patent Literature 2] Japanese Patent Application Laid-Open No. 2006-93354
[Patent Literature 3] Japanese Patent Application Laid-Open No. 2002-348377
[Patent Literature 4] Japanese Patent Application Laid-Open No. 2001-163981
[Patent Literature 5] Japanese Patent Application Laid-Open No. 2000-351949

DISCLOSURE OF THE INVENTION

Problems to be Solved by the Invention

One of the purposes of the present invention is to provide an addition-curable silicone composition which provides a cured product having good performance at a low temperature and excellent resistance to a temperature change, and to provide a semiconductor device having a high reliability, which semiconductor element is encapsulated with the cured product of the addition-curable silicone composition.

Means to Solve the Problems

Thus, the present invention provides an addition-curable silicone resin composition comprising (A) a branched organopolysiloxane represented by the following formula (1):

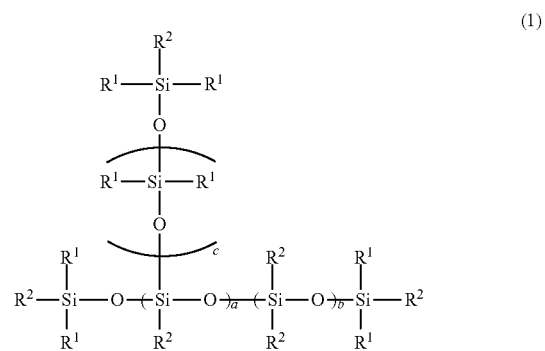

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^1$ and $R^2$ may be the same as or different from each other, at least two of $R^2$ are each an alkenyl group, a is an integer of from 2 to 100, b is an integer of from 5 to 100, c is an integer of from 5 to 100, $0.03 \leq a/(a+b) < 1.0$, and a ratio of the number of $(R^1{}_2R^2SiO_{1/2})$ unit to the number of $(R^2SiO_3/2)$ unit is 2 or less, wherein the parenthesized siloxane units may bond randomly or form a block unit;

(B) an organopolysiloxane represented by the following formula (2):

$$(R^2{}_3SiO_{1/2})_r(R^2{}_2SiO_{2/2})_s(R^2SiO_{3/2})_t(SiO_{4/2})_u \qquad (2)$$

wherein $R^2$ is as defined above, at least two of $R^2$ are each an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800, in an amount of 5 to 900 parts by mass, relative to 100 parts by mass of component (A), (C) an organopolysiloxane having at least two hydrosilyl groups, in an amount such that a ratio of the number of the hydrosilyl groups in component (C) to the number of the alkenyl groups in components (A) and (3) is 0.4 to 4.0, and (D) a hydrosilylation catalyst in an amount sufficient to accelerate hydrosilylation.

Effects of the Invention

According to the present invention, the composition comprising an alkenyl group-containing branched organopolysiloxane which has a lot of the siloxane units having sufficiently longer branch, compared to a main siloxane chain, in combination of the other specific components, provides a cured product which has a lower glass-transition temperature and improved crack resistance, compared to a composition comprising a linear organopolysiloxane which has a similar length of a siloxane chain.

BRIEF EXPLANATION OF THE DRAWING

FIG. 1 shows a graph of the storage elastic modulus and the tangent δs in Example 1 (solid line) and Comparative Example 1 (dotted line).

BEST MODE OF THE INVENTION

The present invention will be described below in detail.
(A) Branched Organopolysiloxane The branched polyorganosiloxane (A) is one of the characteristics of the present invention and is represented by the following formula:

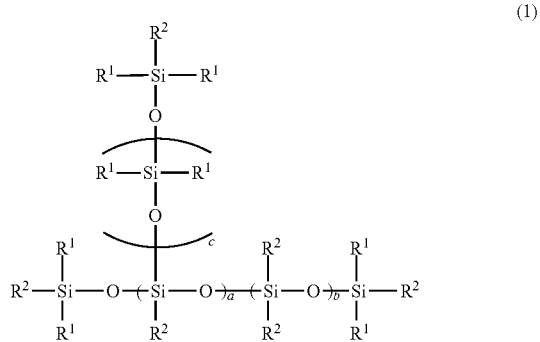

(1)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^1$ and $R^2$ may be the same as or different from each other, at least two of $R^2$ are each an alkenyl group, a is an integer of from 2 to 100, b is an integer of from 5 to 100, c is an integer of from 5 to 100, $0.03 \leq a/(a+b) < 1.0$, and a ratio of the number of $(R^1_2R^2SiO_{1/2})$ unit to the number of $(R^2SiO_{3/2})$ unit is 2 or less, wherein the parenthesized siloxane units may bond randomly or form a block unit.

a is an integer of from 2 to 100, preferably an integer of from 2 to 75, further preferably an integer of from 2 to 50. b is an integer of from 5 to 100, preferably an integer of from 5 to 75, further preferably 10 to 50. c is an integer of from 5 to 100, preferably an integer of from 5 to 75, further preferably 10 to 50. A ratio of the number of $(R^1_2R^2SiO_{1/2})$ unit to the number of $(R^2SiO_{3/2})$ unit is 2 or less. The parenthesized siloxane units may bond randomly or form a block unit. In the formula (1), $0.03 \leq a/(a+b) < 1.0$, further preferably $0.09 \leq a/(a+b) \leq 0.9$.

$R^1$ is, independently of each other, a substituted or unsubstituted, saturated hydrocarbon group having 1 to 12 carbon atoms, or a substituted or unsubstituted, aromatic hydrocarbon group having 6 to 12 carbon atoms. Examples of the saturated hydrocarbon group include alkyl groups such as a methyl group, an ethyl group, a propyl group, a butyl group, and an octyl group, and cycloalkyl groups such as a cyclopentyl group and a cyclohexyl group; and those hydrocarbon groups wherein a part or all of the hydrogen atoms are substituted with a substituent such as a halogen atom such as a fluorine atom, a bromine atom and a chlorine atom or a cyano group, e.g., halogen-substituted monovalent hydrocarbon groups such as trifluoropropyl and chloropropyl groups, cyanoalkyl groups such as a β-cyanoethyl group and a γ-cyanopropyl group, a 3-methacryloxypropyl group, a 3-glycidyloxypropyl group, a 3-mercaptopropyl group, and a 3-aminopropyl group. Among these, a methyl group and a cyclohexyl group are preferred. A methyl group is more preferred. Examples of the aromatic hydrocarbon group include aryl groups such as a phenyl group, a tolyl group and a naphthyl group, and aralkyl groups such as a benzyl group, a phenylethyl group and a phenylpropyl group; and those wherein a part or all of the hydrogen atoms bonded to the carbon atoms are substituted with a substituent such as a halogen atom such as a fluorine atom, a bromine atom and a chlorine atom, or a cyano group. Among these, a phenyl group and a tolyl group are preferred. A phenyl group is more preferred. At least one of $R^1$ is an aromatic hydrocarbon group having 6 to 12 carbon atoms.

$R^2$ is, independently of each other, selected from a substituted or unsubstituted, saturated hydrocarbon group having 1 to 12 carbon atoms, preferably 1 to 8 carbon atoms, a substituted or unsubstituted, aromatic hydrocarbon group having 6 to 12 carbon atoms, preferably 6 to 10 carbon atoms, and an alkenyl group having 2 to 10 carbon atoms, preferably 2 to 8 carbon atoms. Examples of the saturated hydrocarbon group and the aromatic hydrocarbon group may be those groups defined for R. Examples of the alkenyl group include a vinyl group, an allyl group, a propenyl group, a hexenyl group and a styryl group. Among these, a vinyl group and an allyl group are preferred, and a vinyl group is further preferred.

In component (A), the number of the monovalent aromatic hydrocarbon group bonded to a silicon atom is preferably 3% or more, further preferably 5% or more, and 90% or less, further preferably 80% or less, based on a total number of the groups each bonded to a silicon atom. When the branched organopolysiloxane (A) has the monovalent aromatic hydrocarbon group in the aforesaid amount, a cured product from (A) has a higher refraction index and a lower gas permeability, so that the composition is suitable for encapsulating semiconductor elements.

The branched organopolysiloxane may be prepared in a method comprising steps of
subjecting an organopolysiloxane represented by the following formula (4):

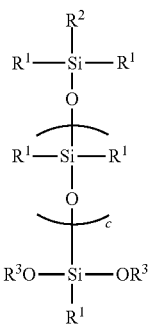

(4)

wherein $R^1$, $R^2$ and c are as defined above, and $R^3$ is a hydrogen atom or a saturated hydrocarbon group having 1 to 6 carbon atoms,
to a co-condensation reaction with other siloxanes such as an organopolysiloxane which has alkoxysilyl groups or hydroxysilyl groups, i.e. silanol groups, at both terminals and is represented by the following formula (5):

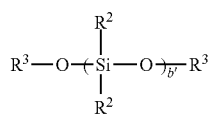

(5)

wherein $R^2$ and $R^3$ are as defined above, b' is at least 1 and at most same as b, and b is as defined above,
subsequently an end-capping reaction with other silane such as a hydrolyzable group-containing silane compound represented by the following formula (6):

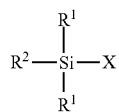

(6)

wherein $R^1$ and $R^2$ are as defined above, X is a halogen atom or a group represented by $R^3O$—, wherein $R^3$ is as defined above, to thereby obtain a branched organopolysiloxane (A). In the formula (4), $R^3$ is a hydrogen atom or a saturated hydrocarbon group having 1 to 6 carbon atoms, such as a methyl group, an ethyl group, a propyl group, a butyl group, an isopropyl group, a hexyl group and a cyclohexyl group. Among these, a methyl group and an ethyl group are preferred. A methyl group is particularly preferred.

The organopolysiloxane having two alkoxy groups at one terminal may be synthesized in any known manners. For instance, Japanese Patent Application Laid-Open No. Sho 59-78236 describes a method where a cyclic silicon compound is ring-opening polymerized in the presence of a metal silanolate as an initiator, the reaction at the terminal is stopped by an acid and, then, the terminal is reacted with a trialkoxysilane. Japanese Patent Application Laid-Open No. Hei 7-224168 describes that a cyclic silicon compound is polymerized in the presence of a silanol compound as an initiator and a pentacoordinate silicon as a catalyst and, then, the terminal of the polymer obtained is reacted with a trialkoxysilane.

(B) Organosiloxane (B) Organosiloxane is represented by the following formula (2):

$$(R^2{}_3SiO_{1/2})_r(R^2{}_2SiO_{2/2})_s(R^2SiO_{3/2})_t(SiO_{4/2})_u \qquad (2)$$

wherein $R^2$ is as defined above, at least two of $R^2$ are each an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800.

r is an integer of from 0 to 100, preferably an integer of from 0 to 75, further preferably an integer of from 0 to 50. s is an integer of from 0 to 300, preferably an integer of from 0 to 200, further preferably an integer of from 0 to 100. t is an integer of from 0 to 200, preferably an integer of from 0 to 100, further preferably an integer of from 0 to 50. u is an integer of from 0 to 200, preferably an integer of from 0 to 100, further preferably an integer of from 0 to 50. A total of t and u is 1 to 400, preferably 1 to 200, further preferably 1 to 100. A total of r, s, t and u is 2 to 800, preferably 2 to 400, further preferably 2 to 200.

The examples of $R^2$ are as defined for component (A).

In component (B), the number of the monovalent aromatic hydrocarbon group bonded to a silicon atom is preferably 3% or more, further preferably 5% or more, and 90% or less, further preferably 80% or less, based on a total number of the groups each bonded to a silicon atom. When the branched organopolysiloxane (B) has the monovalent aromatic hydrocarbon group in the aforesaid amount, the branched organopolysiloxane has a higher refraction index and a lower gas permeability and is well compatible with component (A), so that the cured product has an excellent transparency and mechanical strength. Therefore, the composition is suitable for encapsulating semiconductor elements.

An amount of component (B) is 5 to 900 parts by mass, preferably 10 to 800 parts by mass, further preferably 20 to 600 parts by mass, relative to 100 parts by mass of component (A). When the composition comprises component (B) in the aforesaid amount, a cured product is rubbery.

(C) Organopolysiloxane Having at Least Two Hydrosilyl Groups

The organopolysiloxane having at least two hydrosilyl groups is preferably represented by the following formula (3), but is not limited.

$$(R^3{}_3SiO_{1/2})_{r'}(R^3{}_2SiO_{2/2})_{s'}(R^3SiO_{3/2})_{t'}(SiO_{4/2})_{u'} \qquad (3)$$

wherein $R^3$ is, independently of each other, a hydrogen atom, a substituted or unsubstituted, saturated hydrocarbon group having 1 to 12 carbon atoms, or a substituted or unsubstituted, aromatic hydrocarbon group having 6 to 12 carbon atoms, at least two of $R^3$ are each a hydrogen atom, r' is an integer of from 0 to 100, s' is an integer of from 0 to 300, t' is an integer of from 0 to 200, u' is an integer of from 0 to 200, and a total of r', s', t' and u' is 2 to 800.

Examples of the substituted or unsubstituted, saturated hydrocarbon group having 1 to 12 carbon atoms, and the substituted or unsubstituted, aromatic hydrocarbon group having 6 to 12 carbon atoms may be those defined for $R^1$. At least two of $R^3$ are each a hydrogen atom and the remaining $R^3$ is preferably a methyl group or a phenyl group. r' is an integer of from 0 to 100, preferably an integer of from 0 to 75, further preferably an integer of from 0 to 50. s' is an integer of from 0 to 300, preferably an integer of from 0 to 200, further preferably an integer of from 0 to 100. t' is an integer of from 0 to 200, preferably an integer of from 0 to 100, further preferably an integer of from 0 to 50. u' is an integer of from 0 to 200, preferably an integer of from 0 to 100, further preferably an integer of from 0 to 50. A total of r', s', t' and u' is 2 to 800, preferably 2 to 400, further preferably 2 to 200.

Component (C) has a monovalent aromatic hydrocarbon group bonded to a silicon atom, preferably in an amount of 3% or more, further preferably 5% or more, to 80% or less in number, based on a total number of the groups each bonded to a silicon atom. When the organopolysiloxane (C) has the aromatic hydrocarbon group in the aforesaid amount, the cured product has a higher refraction index; and a lower gas permeability and component (C) is well compatible with components (A) and (B), so that the cured product has an excellent transparency. Therefore, the composition is suitable for encapsulating semiconductor elements.

An amount of component (C) may be such that a ratio of the number of the hydrosilyl groups in component (C) to a total number of the alkenyl groups in components (A) and (B) is 0.4 to 4, preferably 0.6 to 2.0, further preferably 0.8 to 1.6. If the amount is less than the afore-mentioned lower limit, the amount of an SiH group is insufficient and, thereby, curing does not proceed satisfactorily. If the amount exceeds the afore-mentioned upper limit, an unreacted SiH group cause a side reaction such as a dehydrogenation.

(D) Hydrosilylation Catalyst

Any known catalyst which can accelerate the hydrosilylation may be used and not particularly limited. Preferred is a catalyst selected from an element of the platinum group metals and a compound including an element of the platinum group metals. Examples of these catalysts include platinum catalysts such as platinum, including platinum black, platinum chloride, a chloroplatinic acid, a complex of platinum with an olefin such as a complex of platinum with a divinylsiloxane, and a complex of a platinum with a carbonyl; palladium catalysts; and rhodium catalysts. The catalyst may be used singly or two or more in combination of them. Preferred are chloroplatinic acid and a complex of platinum with an olefin such as a complex of platinum with divinylsiloxane.

Component (D) may be used in a catalytic amount. The catalytic amount is such that the hydrosilylation is accelerated and may be properly decided, depending on a desired curing rate. For instance, when a platinum group metal catalyst is used, the amount, reduced to a platinum group metal, is preferably $1.0 \times 10^{-4}$ to 1.0 part by mass, more preferably $1.0 \times 10^{-3}$ to $1.0 \times 10^{-1}$ part by mass, relative to the total 100 parts by mass of components (A), (B) and (C), in view of reactivity.

Optional Components

The present silicone composition may further comprise other additives such as a fluorescent material, an inorganic filler, an adhesion-imparting agent, and a curing inhibitor in addition to components (A) to (D), if needed. Each of components will be explained below in detail.

Fluorescent Material

Any conventional fluorescent material may be used and not particularly limited. For instance, preferred is such that absorbs light generated by a semiconductor light-emitting diode having, as a light emitting layer, a semiconductor element, in particular a nitride semiconductor element, and converts its wavelength to different one. The fluorescent material is preferably selected from, for instance, the group consisting of nitride fluorescent materials and oxynitride fluorescent materials which are activated mainly by lanthanide elements such as Eu and Ce; fluorescent materials activated mainly by lanthanide elements such as Eu or by transition metal elements such as Mn, such as alkaline earth metal halogen apatites, alkaline earth metal halogen borates, alkaline earth metal aluminates, alkaline earth metal silicates, alkaline earth metal sulfides, alkaline earth metal thiogallates, alkaline earth metal silicon nitrides and germinates; rare earth metal aluminates and rare earth metal silicates which are activated mainly by lanthanide elements such as Ce; organic fluorescent materials and organic complex fluorescent materials which are activated mainly by lanthanide elements such as Eu; and Ca—Al—Si—O—N type oxynitride glass fluorescent materials.

Examples of the nitride fluorescent material which is activated mainly by lanthanide elements such as Eu and Ce include $M_2Si_5N_8$:Eu, $MSi_7N_{10}$:Eu, $M_{1.8}Si_5O_{0.2}N_8$:Eu and $M_{0.9}Si_7O_{0.1}N_{10}$:Eu, wherein M is at least one selected from the group consisting of Sr, Ca, Ba, Mg and Zn.

Examples of the oxynitride fluorescent material which is activated mainly by lanthanide elements such as Eu and Ce include $MSi_2O_2N_2$:Eu, wherein M is at least one selected from the group consisting of Sr, Ca, Ba, Mg and Zn.

Examples of the alkaline earth metal halogen apatite fluorescent material which is activated mainly by lanthanide elements such as Eu or transition metal elements such as Mn include $M_5(PO_4)_3X$:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal halogen borate fluorescent material include $M_2B_5O_9X$:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal aluminate fluorescent material include $SrAl_2O_4$: R, $Sr_4Al_{14}O_{25}$:R, $CaAl_2O_4$: R, $BaMg_2Al_{16}O_{27}$:R, $BaMg_2Al_{16}O_{12}$:R and $BaMgAl_{10}O_{17}$: R, wherein R is at least one of Eu and Mn.

Examples of the alkaline earth metal sulfide fluorescent material include $La_2O_2S$:Eu, $Y_2O_2S$:Eu and $Gd_2O_2S$:Eu.

Examples of the rare earth metal aluminate fluorescent material which is activated mainly by lanthanide elements such as Ce include YAG type fluorescent materials represented by compositional formulas: $Y_3Al_5O_{12}$:Ce, $(Y_{0.8}Gd_{3.2})_3Al_5O_{12}$:Ce, $Y_3(Al_{0.8}Ga_{0.2})_5O_{12}$:Ce, and $(Y,Gd)_3(Al,Ga)_5O_{12}$ and those compounds where a part or the whole of Y are replaced with Tb or Lu, such as $Tb_3Al_5O_{12}$:Ce and $Lu_3Al_5O_{12}$:Ce.

Examples of the other fluorescent materials include ZnS: Eu, $Zn_2GeO_4$:Mn and $MGa_2S_4$:Eu, wherein M is at least one selected from the group consisting of Sr, Ca, Ba, Mg and Zn, and X is at least one selected from the group consisting of F, 01, Br and I.

The afore-mentioned fluorescent materials may comprise at least one selected from the group consisting of Tb, Cu, Ag, Au, Cr, Nd, Dy, Co, Ni and Ti, in place of Eu or in addition to Eu, if needed.

The Ca—Al—Si—O—N type oxynitride glass fluorescent material comprises, as a matrix, oxynitride glass comprising 20 to 50 mole % of $CaCO_3$, calculated as CaO, 0 to 30 mole % of $Al_2O_3$, 25 to 60 mole % of SiO, 5 to 50 mole % of AlN and 0.1 to 20 mole % of rare earth metal oxides or transition metal oxides, wherein the total amount of the aforesaid components is 100 mole %. The fluorescent material with the oxynitride glass matrix preferably comprises nitrogen atoms in an amount of 15 weight % or less and preferably comprises, besides rare earth metal oxides ions, the other rare earth metal ions which work as a sensitizer in an amount of 0.1 to 10 mole %, calculated as rare earth metal oxides, in the fluorescent glass as a co-activator.

Other fluorescent materials which have a similar function and provide similar effects may be used.

An amount of the fluorescent material is preferably 0.1 to 2,000 parts by mass, more preferably 0.1 to 100 parts by mass, relative to 100 parts by mass of the components other than the fluorescent material, for instance, 100 parts by mass of components (A) to (D). When the present cured product is used as a wavelength conversion film comprising a fluorescent material, the amount of the fluorescent material is preferably 10 to 2,000 parts by mass. The fluorescent material preferably has a mean diameter of 10 nm or more, more preferably 10 nm to 10 μm, further preferably 10 nm to 1 μm. The mean diameter is determined from a particle size distribution obtained in a laser diffraction method using a Cilas laser measurement instrument.

Inorganic Filler

Examples of the inorganic filler include silica, fumed silica, fumed titanium dioxide, alumina, calcium carbonate, calcium silicate, titanium dioxide, iron (III) oxide and zinc oxide. The inorganic filler may be used singly or in combination of two or more of them. An amount of the inorganic filler may be 20 parts by mass or less, preferably 0.1 to 10 parts by mass, relative to total 100 parts by mass of components (A) to (D), but not limited to these.

Adhesion-Imparting Agent

The present silicone composition may comprise an adhesion-imparting agent in order to add adhesiveness to a cured product, if needed. Examples of the adhesion-imparting agent include organosiloxane oligomers having at least two, preferably three, functional groups selected from the group consisting of a hydrogen atom bonded to a silicon atom, an alkenyl group, an alkoxy group and an epoxy group. The organosiloxane oligomer preferably has 4 to 50 silicon atoms, more preferably 4 to 20 silicon atoms. The adhesion-imparting agent may be organooxysilyl-modified isocyanurate represented by the following general formula (7) or a hydrolysis and condensation product of the compound, i.e. organosiloxane-modified isocyanurate.

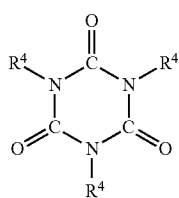
(7)

$R^4$ is, independently of each other, an organic group represented by the following formula (8) or an unsaturated aliphatic monovalent hydrocarbon group.

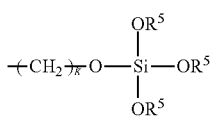
(8)

wherein $R^5$ is a hydrogen atom or a monovalent hydrocarbon group having 1 to 6 carbon atoms and k is an integer of from 1 to 6, preferably 1 to 4.

An amount of the adhesion-imparting agent is 10 parts by mass or less, preferably 0.1 to 8 parts by mass, more preferably 0.2 to 5 parts by mass, relative to total 100 parts by mass of components (A) to (D). When the amount of the adhesion-imparting agent does not exceed the aforesaid upper limit, high hardness of the cured product is attained and surface tackiness of the cured product is avoided.

Curing Inhibitor

The present silicone composition may further comprise a curing inhibitor in order to suppress the reactivity to improve storage stability. Examples of the curing inhibitor include triallylisocyanurate, alkyl maleate, acetylene alcohols, silane-modified or siloxane-modified product of these, hydroperoxide, tetramethylethylenediamine, benzotriazole and a mixture of them. An amount of the curing inhibitor is preferably 0.001 to 1.0 part by mass, further preferably 0.005 to 0.5 part by mass, relative to the total 100 parts by mass of components (A) to (D).

Other Additives

The present silicone composition may comprise other additives besides the aforesaid components. Examples of the other additives include anti-aging agents, radical polymerization inhibitors, flame retardants, surfactants, antiozonants, light stabilizers, thickeners, plasticizers, antioxidants, heat stabilizers, electrical conductivity-imparting agents, antistatic agents, radiation insulating agents, nucleating agents, phosphorus-type peroxide decomposers, lubricants, pigments, metal-inactivating agents, physical property-adjusting agents and organic solvents. These optional components may be used singly or in combination of two or more of them.

The simplest embodiment of the present silicone composition consists of components (A), (B), (C) and (0). The composition consisting of components (A), (B), (C) and (D) and the fluorescent material is also preferred. In particular, it is preferred that the composition does not comprise any inorganic filler such as silica, in order to prepare a cured product having a higher transparency. The inorganic filler is as described above.

The present curable composition may be prepared in any known manners. For instance, the composition may be prepared by mixing component (A), component (B), component (C) and component (D) in any manner. Meanwhile, the composition may be prepared by mixing component (A), component (B), component (C), component (D) and the fluorescent material and/or the other components in any manner. For instance, the aforesaid components are placed in a commercial stirrer, such as THINKY CONDITIONING MIXER, ex Thinky Corporation, and mixed homogeneously for about 1 to 5 minutes to prepare the present silicone composition.

The present curable composition may be cured in any known manners. Curing conditions are not particularly limited. For instance, the composition may be cured at 60 to 180 degrees C. for 1 to 12 hours. In particular, the composition is cured stepwise in the range of 60 to 150 degrees C. The stepwise curing preferably consists of the following two steps. The curable composition is first heated at 60 to 100 degrees C. for 0.5 to 2 hours to be defoamed sufficiently. Subsequently, the composition is heated at 120 to 180 degrees C. for 1 to 10 hours to cure. Through these steps, the composition is sufficiently cured, no bubble occur and the cured product is colorless and transparent, even when a cured product has a large thickness. In the present specification, "colorless and transparent" means that a light transmittance at 450 nm of a cured product having a thickness of 1 mm is 80% or more, preferably 85% or more, particularly preferably 90% or more.

The curable composition provides a cured product having a high optical transparency. Accordingly, the present silicone composition is useful as an encapsulating material for LED elements, in particular blue LED elements and violet LED elements. The encapsulation of LED elements with the present curable composition may be carried out in any known manners. For instance, a dispense method and a compression molding method may be used.

On account of the properties such as excellent crack resistance, heat resistance, light resistance and transparency, the present curable composition and cured product are useful also as materials for displays, optical recording mediums, optical apparatus, optical components and optical fibers, and photo/electron functional organic materials and materials for integrated semiconductor circuit-related elements.

EXAMPLES

The present invention will be explained below in further detail with reference to a series of the Examples and the Comparative Examples, though the present invention is in no way limited by these Examples.

In the following descriptions, the weight average molecular weight (Mw) was determined by gel permeation chromatography, i.e., GPC, and reduced to polystyrene. Conditions in the GPC were as follows.
[GPC Conditions]
Solvent: Tetrahydrofuran
Flow rate: 0.6 mL/min.
Columns: all provided by TOSOH Cop.
TSK Guardcolumn SuperH-L
TSKgel SuperH4000(6.0 mmI.D.×15 cm×1)
TSKgel SuperH3000(6.0 mmI.D.×15 cm×1)
TSKgel SuperH2000(6.0 mmI.D.×15 cm×2)
Column Temperature: 40 degrees C.
Injection Volume: 20 micro liters of a 0.5% by weight solution in THF.
Detector: Differential refractive index detector (RI)

An amount of a Vi group (mol/100 g) and an amount of an SiH group (mol/100 g) were calculated from a value of an integral value of a hydrogen atom which was obtained in $^1$H-NMR spectra at 400 MHz, using dimethylsulfoxide as an internal standard. The $^1$H-NMR spectra was obtained with ULTRASHIELD™ 400PLUS, ex BRUKER Corporation. $^{29}$Si-NMR spectra was obtained with RESONANCE500, ex JEOL Ltd.

The synthesis example of component (A) used in the Examples will be described below. In the following, Me is abbreviation for a methyl group and Ph is abbreviation for a phenyl group.

Synthesis Example 1

(a-1)

96.3 Grams of lithium trimethylsilanolate, 1,560 grams of hexamethylcyclotrisiloxane, and 4,160 grams of hexaphenylcyclotrisiloxane were added in toluene, stirred at 100 degrees C. for 12 hours and, then, neutralized with 90.0 grams of acetic acid. The product obtained was filtrated. Then, 408 grams of methyltrimethoxysilane and 8.10 grams of Sr(OH)$_2$. 8H$_2$O were added to the residue and stirred at 60 degrees C. for 3 hours. Then, 12.2 grams of acetic acid were added to the reaction mixture to neutralize it, the product obtained was filtrated, and methanol and toluene were distilled off at a reduced pressure to thereby obtain an organopolysiloxane (a-1) which has two alkoxy groups at one terminal and represented by the following formula. Its Mw was 6,000.

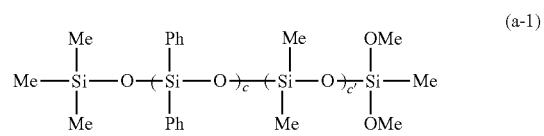

wherein c and c' are 20.

(A-1)

600 Grams of the organopolysiloxane obtained in the step (a-1), 140 grams of polymethylphenylsiloxane-α,ω-diol, Mw=530, and 0.810 gram of Sr(OH)$_2$.8H$_2$O were mixed and stirred at 60 degrees C. for 18 hours. Then, 1.22 grams of acetic acid were added to the mixture to neutralize it. 17.1 Grams of chlorodimethylvinylsilane were added to the mixture and stirred at 60 degrees C. for 8 hours. The mixture was filtrated. The residue was washed with water, and, then, subjected to azeotropic dehydration, and the solvent was distilled off to obtain a branched silicone oil represented by the following formula, hereinafter referred to as organopolysiloxane (A-1). Its Mw was 27,000. The amount of the Vi group was 7.41×10$^{-3}$ mol/100 g. The organopolysiloxane (A-1) was analyzed by $^{29}$Si-NMR to find that in the following formula, a was 4, b was 40, c was 20 and c' was 20.

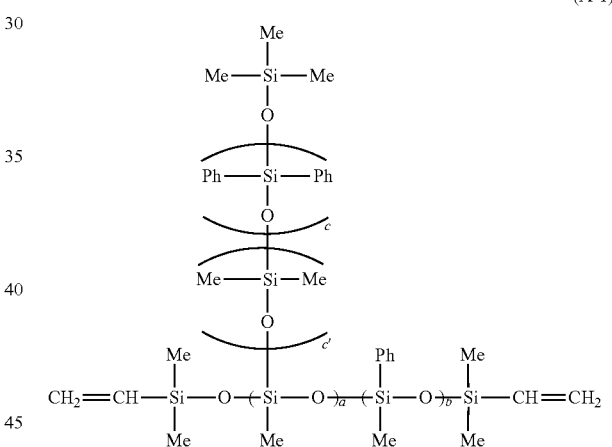

Synthesis Example 2

(a-2)

96.3 Grams of lithium trimethylsilanolate, 222 grams of hexamethylcyclotrisiloxane, and 595 grams of hexaphenylcyclotrisiloxane were added in toluene, stirred at 100 degrees C. for 3 hours and, then, neutralized with 90.0 grams of acetic acid. The product obtained was filtrated. Then, 408 grams of methyltrimethoxysilane and 8.10 grams of Sr(OH)$_2$.8H$_2$O were added to the residue and stirred at 60 degrees C. for 3 hours. Then, 12.2 grams of acetic acid were added to the reaction mixture to neutralize it, the product obtained was filtrated, and methanol and toluene were distilled off at a reduced pressure to thereby obtain an organopolysiloxane (a-2) which has two alkoxy groups at one terminal and represented by the following formula. Its Mw was 1,000.

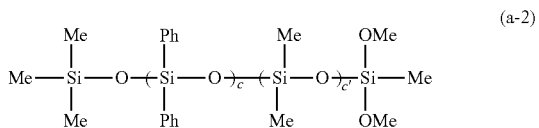
(a-2)

wherein c and c' are 3.

(A-2)

100 Grams of the organopolysiloxane obtained in the step (a-2), 27.9 grams of polymethylphenylsiloxane-α,ω-diol, Mw=530, and 0.64 gram of $Sr(OH)_2 \cdot 8H_2O$ were mixed and stirred at 60 degrees C. for 3 hours. Then, 0.960 gram of acetic acid was added to the mixture to neutralize it. 24.4 Grams of chlorodimethylvinylsilane were added to the mixture and stirred at 60 degrees C. for 8 hours. The mixture was filtrated. The residue was washed with water, and, then, subjected to azeotropic dehydration, and the solvent was distilled off to obtain a branched silicone oil represented by the following formula, hereinafter referred to as organopolysiloxane (A-2). Its Mw was 3,300. The amount of the Vi group was $6.06 \times 10^{-2}$ mol/100 g. The organopolysiloxane (A-2) was analyzed by $^{29}$Si-NMR to find that in the following formula, a was 3, b was 6, c was 3 and c' was 3.

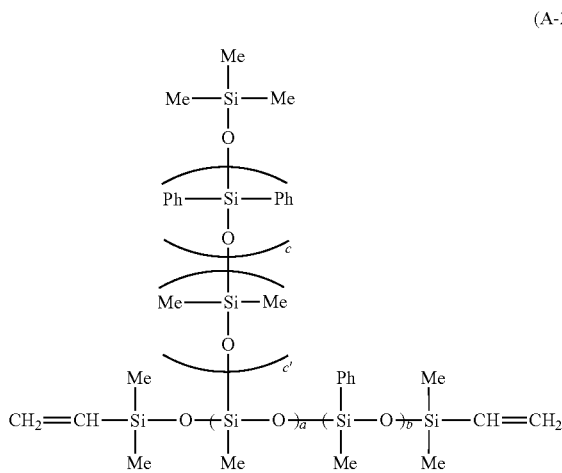
(A-2)

Synthesis Example 3

(a-3)

90.1 Grams of trimethylsilanol, 6,660 grams of hexamethylcyclotrisiloxane, and 121 grams of sodium salt of phenylsiloxy dicatechol were added in acetonitrile, stirred at 60 degrees C. for 12 hours. The product obtained was filtrated. Then, 408 grams of methyltrimethoxysilane and 8.10 grams of $Sr(OH)_2 \cdot 8H_2O$ were added to the residue and stirred at 60 degrees C. for 3 hours. Then, 12.2 grams of acetic acid were added to the reaction mixture to neutralize it, the product obtained was filtrated, and methanol and toluene were distilled off at a reduced pressure to thereby obtain an organopolysiloxane (a-3) which has two alkoxy groups at one terminal and represented by the following formula. Its Mw was 6,800.

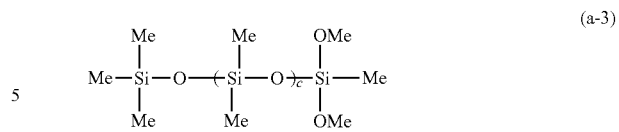
(a-3)

wherein c is 90.

(A-3)

680 Grams of the organopolysiloxane obtained in the step (a-3), 72.0 grams of polydimethylsiloxane-α,ω-diol, Mw=280, and 3.76 grams of $Sr(OH)_2 \cdot 8H_2O$ were mixed and stirred at 60 degrees C. for 18 hours. Then, 5.64 grams of acetic acid were added to the mixture to neutralize it. 13.0 Grams of chlorodimethylvinylsilane were added to the mixture and stirred at 60 degrees C. for 8 hours. The mixture was filtrated. The residue was washed with water, and, then, subjected to azeotropic dehydration, and the solvent was distilled off to obtain a branched silicone oil represented by the following formula, hereinafter referred to as organopolysiloxane (A-3). Its Mw was 73,000. The amount of the Vi group was $2.74 \times 10^{-3}$ mol/100 g. The organopolysiloxane (A-3) was analyzed by $^{29}$Si-NMR to find that in the following formula, a was 10, b was 90, and c was 90.

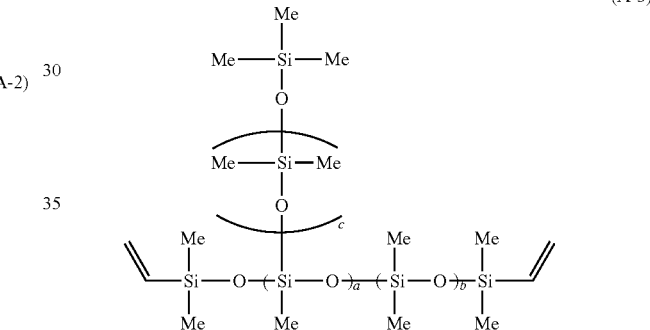
(A-3)

Synthesis Example 4

(a-4)

90.1 Grams of trimethylsilanole, 890 grams of hexamethylcyclotrisiloxane, and 121 grams of sodium salt of phenylsiloxy dicatechol were added in acetonitrile, stirred at 60 degrees C. for 6 hours. The product obtained was filtrated. Then, 408 grams of methyltrimethoxysilane and 8.10 grams of $Sr(OH)_2 \cdot 8H_2O$ were added to the residue and stirred at 60 degrees C. for 3 hours. Then, 12.2 grams of acetic acid were added to the reaction mixture to neutralize it, the product obtained was filtrated, and methanol and toluene were distilled off at a reduced pressure to thereby obtain an organopolysiloxane (a-4) which has two alkoxy groups at one terminal and represented by the following formula. Its Mw was 1,000.

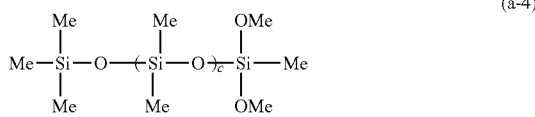
(a-4)

wherein c is 12.

(A-4)

1,000 Grams of the organopolysiloxane obtained in the step (a-4), 12.0 grams of polydimethylsiloxane-α,ω-diol, Mw=280, and 5.06 grams of $Sr(OH)_2 \cdot 8H_2O$ were mixed and stirred at 60 degrees C. for 18 hours. Then, 7.59 grams of acetic acid were added to the mixture to neutralize it. 340 Grams of chlorodimethylvinylsilane were added to the mixture and stirred at 60 degrees C. for 8 hours. The mixture was filtrated. The residue was washed with water, and, then, subjected to azeotropic dehydration, and the solvent was distilled off to obtain a branched silicone oil represented by the following formula, hereinafter referred to as organopolysiloxane (A-4). Its Mw was 81,000. The amount of the Vi group was $2.74 \times 10^{-3}$ mol/100 g. The organopolysiloxane (A-4) was analyzed by $^{29}$Si-NMR to find that in the following formula, a was 80, b was 12, and c was 12.

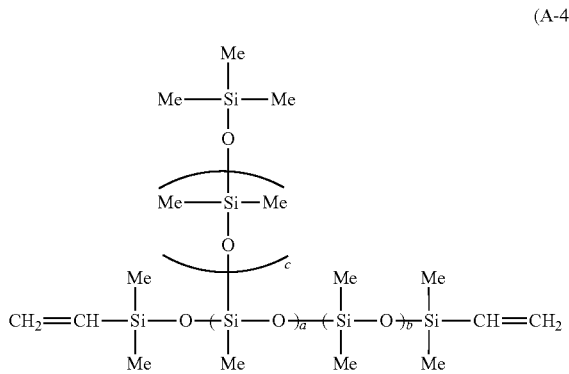

(A-4)

Comparative Example 1

(A-1')

Phenylmethylsilicone oil which has vinyl groups at the both terminals and represented by the following formula, ex Shin-Etsu Chemical Co., Ltd. The amount of the Vi group was $3.81 \times 10^{-2}$ mol/100 g.

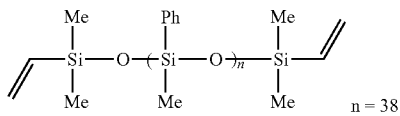

n = 38

Comparative Example 2

(A-2')

Dimethylsilicone oil which has vinyl groups at the both terminal and represented by the following formula, ex Shin-Etsu Chemical Co., Ltd. The amount of the Vi group was $1.33 \times 10^{-2}$ mol/100 g.

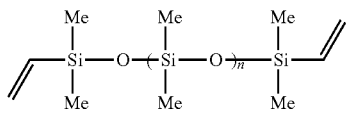

wherein n is 200 on average.

Comparative Example 3

(A-3')

63.7 Grams of 1,1-diphenyl-1,3-dimethyl-3,3-dimethoxy-disiloxane, 1,200 grams of polymethylphenylsiloxane-α,ω-diol, Mw=530, and 48.8 grams of dimethylvinylmethoxysilane were mixed and heated to 60 degrees C. 3.15 Grams of $Sr(OH)_2 \cdot 8H_2O$ were added to the mixture and, then, these compounds were reacted at 60 degrees C. for 3 hours. The catalyst was removed from the reaction mixture by filtration and, then, methanol and water were distilled off at a reduced pressure to obtain a branched silicone oil represented by the following formula. Its Mw was 5,700. An amount of the Vi group was $3.51 \times 10^{-2}$ mol/100 g. The organopolysiloxane was analyzed by $^{29}$Si-NMR to find that in the following formula, n was 37 and m was 1.

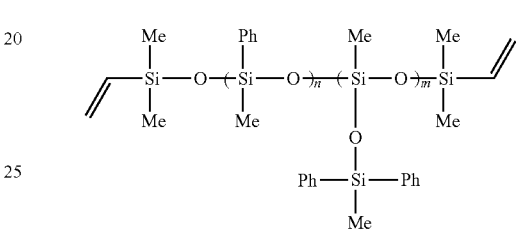

Components (B), (C) and (D)

Components (B), (C) and (D) used in the following Examples are as follows.

(B-1) Phenyl type silicone resin represented by the following formula, which has 0.147 mol/100 g of a Vi group and 1,600 of weight-average molecular weight, ex Shin-Etsu Chemical Co., Ltd.:

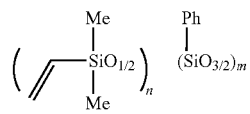

wherein n is 3 and m is 10.

(B-2) Methyl type silicone resin represented by the following formula, which has $9.12 \times 10^{-2}$ mol/100 g of a Vi group and 5,800 of weight-average molecular weight, ex Shin-Etsu Chemical Co., Ltd.:

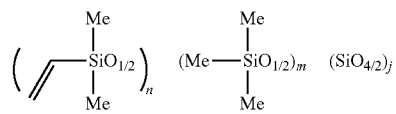

wherein n is 5, m is 30 and j is 48.

(C-1) Silicone oil which is represented by the following formula, has hydrosilyl groups at both terminals and has 0.600 mol/100 g of an SiH group, ex Shin-Etsu Chemical Co., Ltd.:

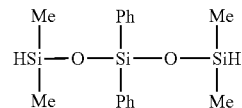

(C-2) Silicone oil which is represented by the following formula, has hydrosilyl groups as a side chain and has 1.63 mols/100 g of an SiH group, ex Shin-Etsu Chemical Co., Ltd.:

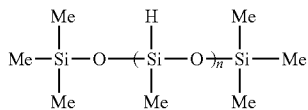

wherein n is 38 on average.

(D) Solution of divinylsiloxane complex of platinum chloride in isododecane containing a platinum metal of 0.5 mass %.

Example 1

100 Parts by mass of component (A-1), 300 parts by mass of component (B-1), 81 parts by mass of component (C-1) were mixed and then, divinylsiloxane complex of platinum chloride was added in an amount, reduced as a platinum metal, of 5 ppm relative to the total mass of the mixture, to obtain the curable composition.

Examples 2 to 4 and Comparative Examples 1 to 3

The manner of Example 1 was repeated, except that the amounts of the components were changed as seen in Table 1 to obtain curable compositions.

The curable compositions prepared in Examples 1 to 4 and Comparative Examples 1 to 3 were evaluated according to the following manners.

[1. Viscosity of the Curable Compositions]

The viscosity of the curable composition was determined with a B-type viscometer at 23 degrees C. according to the Japanese Industrial Standards (JIS) Z 8803:2011. The results are as shown in Table 1.

[2. Hardness of the Cured Products]

The curable composition was poured into an aluminum petri dish having a diameter of 50 mm and a depth of 10 mm and, then, heated at 60 degrees C. for one hour, 100 degrees C. for one hour and, subsequently 150 degrees C. for 4 hours to obtain a cured product. A hardness of the cured product was determined with durometer type A or D according to the Japanese Industrial Standards (JIS) K 6253-3:2012. The results are as shown in Table 1.

[3. Light Transmittance of the Cured Products]

A concave Teflon(Trademark) spacer having a depth of 1 mm was sandwiched by two glass slides having dimensions of 50 mm×20 mm×1 mm and tightly held. The curable composition was poured into the dent of the concave Teflon spacer and heated at 60 degrees C. for one hour, 100 degrees C. for one hour and, subsequently 150 degrees C. for 4 hours to cure, to obtain a sample. A transmittance at 450 nm of the sample was determined with a spectrophotometer, U-4100, ex Hitachi High-Technologies Corporation. The results are as shown in Table 1.

[4. Tensile Strength and Elongation at Break of the Cured Products]

The curable composition was poured into a Teflon-coated mold having a cavity of 150 mm×200 mm×2 mm, and cured stepwise at 60 degrees C. for one hour, 100 degrees C. for one hour and, subsequently 150 degrees C. for 4 hours to obtain a sample. A tensile strength and elongation at break of the cured product were determined according to JIS K 6251:2010 with EZ TEST, EZ-L, ex Shimadzu Corporation, in the following conditions: a tensile speed was 500 mm/min, a distance between clamps was 80 mm, and a distance of gauge points was 40 mm. The results are as shown in Table 1.

[5. Glass-Transition Temperature of the Cured Products]

The storage elastic modulus, MPa, of the cured product prepared as in 4. above procedures was determined at a temperature between −140 degrees C. and 150 degrees C. with DMA Q800, ex TA Instruments. A temperature at a peak in a curved of tangent δ, calculated from obtained storage elastic modulus vs temperature is a glass transition temperature (Tg).

The storage elastic modulus was determined in the following conditions: the sample had a length of 20 mm, a width of 5 mm and a thickness of 1 mm, a rate of temperature rise was 5° C./minute; and a multi-frequency mode, a tension mode, and an amplitude of 15 μm. The results are as shown in Table 1. FIG. 1 shows the storage elastic modulus and the Tangent δ of the Examples (solid line) and these of the Comparative Examples (dotted line).

[6. Thermal Cycle Test]

The curable composition was dispensed on a Tiger3528 package, ex Shin-Etsu Chemical Co., Ltd., and heated at 60 degrees C. for one hour, subsequently at 100 degrees C. for one hour and, then, at 150 degrees C. for four hours to cure, to obtain a sample package encapsulated with the cured product. 20 test samples were subjected to a thermal cycle test (TCT) with 1000 thermal cycles of −50 to 140 degrees C. When the cured product had cracks, it was evaluated as NG. When the test package had no crack, it was evaluated as OK. Number of NG are as shown in Table 1.

TABLE 1

| Component | | Ex. 1 | Ex. 2 | Ex. 3 | Ex. 4 | Com. Ex. 1 | Com. Ex. 2 | Com. Ex. 3 |
|---|---|---|---|---|---|---|---|---|
| Component (A) | (A-1) | 100 | — | — | — | — | — | — |
| | (A-2) | — | 100 | — | — | — | — | — |
| | (A-3) | — | — | 100 | — | — | — | — |
| | (A-4) | — | — | — | 100 | — | — | — |
| | (A-1') | — | — | — | — | 100 | — | — |
| | (A-2') | — | — | — | — | — | 100 | — |
| | (A-3') | — | — | — | — | — | — | 100 |
| Component (B) | (B-1) | 300 | 300 | — | — | 300 | — | 300 |
| | (B-2) | — | — | 100 | 100 | — | 100 | — |
| Component (C) | (C-1) | 75 | 293 | — | — | 80 | — | 119 |
| | (C-2) | — | — | 8.6 | 4 | — | 13 | — |

TABLE 1-continued

|  |  |  |  | Ex. 1 | Ex. 2 | Ex. 3 | Ex. 4 | Com. Ex. 1 | Com. Ex. 2 | Com. Ex. 3 |
|---|---|---|---|---|---|---|---|---|---|---|
| H/Vi |  |  |  | 1 | 3.5 | 1.5 | 0.7 | 1 | 2 | 1.5 |
| Evaluation | Viscosity | 23 degrees C. | Pa · s | 5.6 | 1.2 | 10 | 24 | 7.3 | 8.9 | 0.2 |
|  | Hardness | Shore A | — | — | — | 60 | 35 | — | 70 | 40 |
|  |  | Shore D | — | 40 | 30 | — | — | 45 | — | — |
|  | Transmittance | Thickness of 1 mm, 450 nm | % T | 99.4 | 99.3 | 99.3 | 99.3 | 99.4 | 99.4 | 99.5 |
|  | Tensile strength | 25 degrees C. | MPa | 4.2 | 2.1 | 7.1 | 3.5 | 4.8 | 6.8 | 2.6 |
|  | Elongation at break | 25 degrees C. | % | 70 | 30 | 120 | 100 | 60 | 100 | 70 |
|  | Tg | By DMA | degrees C. | 18 | 12 | −103 | −112 | 35 | −120 | 3 |
|  | Thermal cycle test | 1000 thermal cycles of −50 to/from 140 degrees C. | Number of NG | 0/20 | 0/20 | 0/20 | 0/20 | 20/20 | 12/20 | 18/20 |

In Table 1, H/Vi is a ratio of the total number of the SiH groups in the composition to the total number of the vinyl groups in the composition. NG is the number of the cracked samples.

As seen in Table 1, the present curable silicone resin compositions comprising the present branched organopolysiloxane provided the cured products having a lower glass-transition temperature and an excellent crack resistance, compared to the compositions comprising the linear organopolysiloxane in place of the present branched organopolysiloxane. Additionally, the present resin compositions have a low viscosity and, accordingly its workability is good.

INDUSTRIAL APPLICABILITY

The present invention provides the addition-curable silicone compositions which has good low-temperature properties and temperature-change resistance, and a semiconductor device having an excellent reliability, which semiconductor element is encapsulated with the cured product of the present composition.

The invention claimed is:

1. A semiconductor device comprising a semiconductor element encapsulated with a cured product obtained by curing an addition-curable silicone resin composition comprising
  (A) a branched organopolysiloxane represented by the following formula (1):

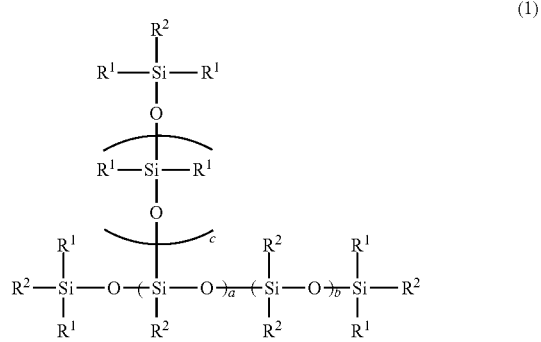

(1)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^1$ and $R^2$ may be the same as or different from each other, at least two of $R^2$ are each an alkenyl group, a is an integer of from 2 to 100, b is an integer of from 5 to 100, c is an integer of from 5 to 100, $0.03 \leq a/(a+b) < 1.0$, and a ratio of the number of $(R^1{}_2R^2SiO_{1/2})$ unit to the number of $(R^2SiO_{3/2})$ unit is 2 or less, wherein the parenthesized siloxane units may bond randomly or form a block unit;

(B) an organopolysiloxane represented by the following formula (2):

$$(R^2{}_3SiO_{1/2})_r(R^2{}_2SiO_{2/2})_s(R^2SiO_{3/2})_t(SiO_{4/2})_u \quad (2)$$

wherein $R^2$ is as defined above, at least two of $R^2$ are each an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800 in an amount of 5 to 900 parts by mass, relative to 100 parts by mass of component (A), (C) an organopolysiloxane having at least two hydrosilyl groups, in an amount such that a ratio of the number of the hydrosilyl groups in component (C) to the number of the alkenyl groups in components (A) and (B) is 0.4 to 4.0, and (D) a hydrosilylation catalyst in an amount sufficient to accelerate hydrosilylation.

2. The semiconductor device according to claim 1, wherein the semiconductor element is a light emitter.

3. A method for preparing an addition-curable silicone resin composition wherein the method comprises steps of subjecting an organopolysiloxane represented by the following formula (4):

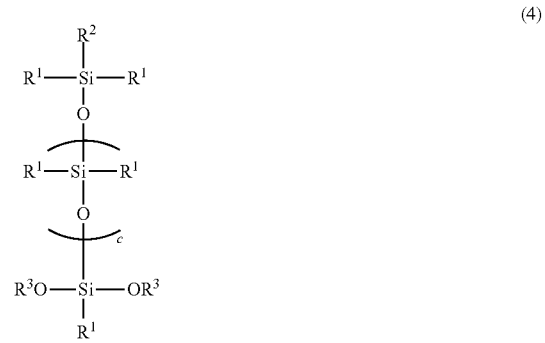

(4)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a substituted or unsubstituted, saturated hydrocarbon group having 1 to 12 carbon atoms, a substituted or unsubstituted, aromatic hydrocarbon group having 6 to 12 carbon atoms, or an alkenyl group having 2 to 10 carbon atoms, $R^1$ and $R^2$ may be the same as or different from each other, at least two of $R^2$ are each an alkenyl group, c is an integer of from 5 to 100, and $R^3$ is a hydrogen atom or a saturated hydrocarbon group having 1 to 6 carbon atoms, to a co-condensation reaction with an organopolysiloxane represented by the following formula (5):

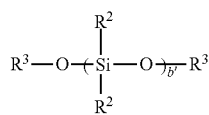
(5)

wherein $R^2$ and $R^3$ are as defined above, b' is at least 1 and at most same as b, and b is an integer of from 5 to 100, and subsequently an end-capping reaction with a hydrolyzable group-containing silane compound represented by the following formula (6):

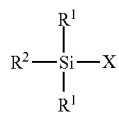
(6)

wherein $R^1$ and $R^2$ are as defined above, X is a halogen atom or a group represented by $R^3O-$, wherein $R^3$ is as defined above, to thereby obtain a reaction product (A), and mixing the reaction product (A) with the following components (B), (C) and (D) to thereby prepare the addition-curable silicone resin composition, (B) an organopolysiloxane represented by the following formula (2):

$$(R^2{}_3SiO_{1/2})_r(R^2{}_2SiO_{2/2})_s(R^2SiO_{3/2})_t(SiO_{4/2})_u \quad (2)$$

wherein $R^2$ is as defined above, at least two of $R^2$ are each an alkenyl group, r is an integer of from 0 to 100, s is an integer of from 0 to 300, t is an integer of from 0 to 200, and u is an integer of from 0 to 200, provided that a total of t and u is 1 to 400 and a total of r, s, t and u is 2 to 800, in an amount of 5 to 900 parts by mass, relative to 100 parts by mass of component (A), (C) an organopolysiloxane having at least two hydrosilyl groups, in an amount such that a ratio of the number of the hydrosilyl groups in component (C) to the number of the alkenyl groups in components (A) and (B) is 0.4 to 4.0, and (D) a hydrosilylation catalyst in an amount sufficient to accelerate hydrosilylation.

4. The method according to claim 3, wherein the reaction product (A) has a monovalent aromatic hydrocarbon group bonded to a silicon atom, in an amount of from 3% or more to 90% or less in number, based on a total number of the groups each bonded to a silicon atom.

5. The method according to claim 3 or 4, wherein component (C) is represented by the following formula (3):

$$(R^3{}_3SiO_{1/2})_{r'}(R^3{}_2SiO_{2/2})_{s'}(R^3SiO_{3/2})_{t'}(SiO_{4/2})_{u'} \quad (3)$$

wherein $R^3$ is, independently of each other, a hydrogen atom, a substituted or unsubstituted, saturated hydrocarbon group having 1 to 12 carbon atoms, or a substituted or unsubstituted, aromatic hydrocarbon group having 6 to 12 carbon atoms, at least two of $R^3$ are each a hydrogen atom, r' is an integer of from 0 to 100, s' is an integer of from 0 to 300, t' is an integer of from 0 to 200, and u' is an integer of from 0 to 200, a total of r', s', t' and u' is 2 to 800.

* * * * *